US006429524B1

United States Patent
Cooney, III et al.

(10) Patent No.: US 6,429,524 B1
(45) Date of Patent: Aug. 6, 2002

(54) ULTRA-THIN TANTALUM NITRIDE COPPER INTERCONNECT BARRIER

(75) Inventors: Edward C. Cooney, III, Jericho; Anthony K. Stamper, Williston, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/853,956

(22) Filed: May 11, 2001

(51) Int. Cl.$^7$ .............................................. H01C 23/48
(52) U.S. Cl. ...................................... 257/762; 257/773
(58) Field of Search ................................ 257/762, 773; 204/192.27; 438/643, 687; 451/41, 57

(56) References Cited

U.S. PATENT DOCUMENTS

| | | | | |
|---|---|---|---|---|
| 5,676,587 A | * | 10/1997 | Landers et al. ................ | 451/57 |
| 5,780,357 A | | 7/1998 | Xu et al. | |
| 6,004,188 A | * | 12/1999 | Roy ............................. | 451/41 |
| 6,069,068 A | * | 5/2000 | Rathore et al. ............. | 438/628 |
| 6,077,775 A | * | 6/2000 | Stumborg et al. ........... | 438/643 |
| 6,077,779 A | | 6/2000 | Shue et al. | |
| 6,100,195 A | * | 8/2000 | Chan et al. .................. | 438/687 |
| 6,200,433 B1 | | 3/2001 | Ding et al. | |
| 6,217,721 B1 | * | 4/2001 | Xu et al. ................ | 204/192.17 |
| 6,288,449 B1 | * | 9/2001 | Bhowmik et al. .......... | 257/762 |

FOREIGN PATENT DOCUMENTS

| | | |
|---|---|---|
| EP | 0 751 566 A2 | 1/1997 |
| EP | 0 751 566 A3 | 2/1997 |

OTHER PUBLICATIONS

Clevenger et al., A Novel Low Temperature CVD/PVD Al Filling Process for Producing Highly Reliable 0.175/spl mu/m Wiring/0.35 spl mu/m Pitch Dual Damascene Interconnections in Gigabit Scale Drams, Jun. 1–3, 1998, pp. 137–139, Interconnect Technology Conference, 1998, Proceedings of the IEEE 1998 International.

Lakshminarayanan et al., Contact and Via Structures With Copper Interconnects Fabricated Using Dual Damascene Technology, Aug. 1994, pp. 306–309, IEEE Electron Device Letters, vol. 15, Issue 8.

Liu et al., Single Mask Metal—Insulator—Metal (MIM) Capacitor With Copper Damascene Metallization For sub–0.18/spl mu/m Mixed Mode Signal and System–on–a–Chip (SoC) Applications, Jun. 5–7, 2000, pp. 110–113, Interconnect Technology Conference, 2000, Proceedings of the IEEE 2000 International.

Mahnkopf et al., System on a Chip Technology Platform For 0.18/spl mu/m Digital, Mixed Signal and eDRAM Applications, Dec. 5–8, 1999, pp. 848–852, Electron Devices Meeting, 1999, IEDM Technical Digest International.

\* cited by examiner

*Primary Examiner*—Hoai V. Ho
*Assistant Examiner*—Thinh Nguyen
(74) *Attorney, Agent, or Firm*—Schmeiser, Olsen & Watts; Howard J. Walter, Jr.

(57) ABSTRACT

A method of fabricating an interconnect for a semiconductor device is disclosed. The method comprises: forming a dielectric layer on a semiconductor substrate; forming a trench in the dielectric layer; placing the semiconductor substrate in a plasma deposition chamber having a tantalum target; initiating a plasma in the presence of nitrogen in the plasma deposition chamber; and depositing an ultra-thin layer comprising tantalum and nitrogen in the trench.

22 Claims, 5 Drawing Sheets

ULTRA-THIN TANTALUM NITRIDE COPPER INTERCONNECT BARRIER

FIELD OF THE INVENTION

The present invention relates to the field of semiconductor interconnect metallurgy; more specifically, it relates to a conformal barrier layer for copper interconnect metallurgy and methods of fabricating the layer.

BACKGROUND OF THE INVENTION

Advanced semiconductor technology utilize copper interconnect metallurgy for wiring of active devices into integrated circuits. Typically interconnect metallurgy is formed by a damascene or dual damascene process. Damascene processes allow for very narrow, high (greater than 1), aspect ratio (height divided by width) high-density wiring features. In a damascene process, a trench is etched into a dielectric layer. A layer of conductor of sufficient thickness to fill the trench is deposited and then a chemical-mechanical-polish (CMP) process performed to remove the conductor deposited on the surface of the dielectric layer. After CMP, only the layers filling the trench remain, the surface of the filled trench being flush with the surface of the dielectric layer. In damascene technology, various interconnect levels are connected by vias independently formed in intervening dielectric layers. In dual damascene technology, the vias are integrally formed in the same dielectric as the conductive wire.

Copper has become the conductor metallurgy of choice because its high conductivity allows for higher currents in the narrower wiring features than could be achieved with older, aluminum based interconnect metallurgy. While copper provides improved electro-migration and mechanical stress reliability, copper is usually used with a redundant conductor, such as tantalum in the form of a thin layer lining the bottom and sidewalls of the trench for improved reliability. However, tantalum is not deposited directly on such dielectrics as silicon oxides because it will form beta-phase tantalum. Beta-phase tantalum has a resistivity of about 200 micro-ohms per centimeter, much too high to be of use as a redundant conducing layer. Further, copper and tantalum generally require an adhesion promotion layer when used with silicon oxide dielectrics. One material used with tantalum and copper as an adhesion promoter is tantalum nitride. When tantalum is deposited on top of tantalum nitride, alpha-phase tantalum is formed. Alpha-phase tantalum has a resistivity of about 12 to 20 micro-ohms per centimeter. Additionally, tantalum nitride acts as a copper diffusion barrier. Copper can change the characteristics of active silicon devices and its migration through the dielectric layers into the silicon must be prevented. This is not only a concern with silicon oxide dielectrics, but is a very strong concern when low-K dielectrics, such as SILK™ (Dow Corning, Midland, Mich.) are used because of the porous nature of low-K materials.

However, by having a resistivity of about 250 to 500 micro-ohm per centimeter, tantalum nitride not a very good conductor. This high resistively becomes increasingly important as the density of interconnects increases and the wire size decreases with 0.25 micron and sub 0.25 micron groundrules. For a trench 0.225 microns wide and deep and a tantalum nitride layer of 25 to 50 nanometers, the tantalum nitride accounts for 30% to 56% of the cross-sectional area of the wire, partially negating the advantages gained due to the increased conductivity of copper. Further, as the aspect ratio of the trench increases the point is reached where only a narrow strip of copper can fit between the sidewalls of the trench, if indeed, the copper can be made to fill the remaining opening at all.

Therefore, there is a need for very thin tantalum nitride layer to be used as a liner in tantalum and tantalum/copper interconnect metallurgy and for a method of fabricating such very thin tantalum nitride layers.

SUMMARY OF THE INVENTION

A first aspect of the present invention is an interconnect for a semiconductor device, comprising: a conductive core having sidewalls and a bottom; and an ultra-thin layer disposed on the sidewalls and the bottom of said conductive core.

A second aspect of the present invention is a method of forming an ultra-thin tantalum nitride layer comprising: providing a tantalum target; initiating an inert gas plasma and flowing nitrogen into the plasma for a predetermined period of time to sputter tantalum nitride onto a substrate; and after expiration of the fixed period of time, stopping the flow of nitrogen.

A third aspect of the present invention is a method of forming an ultra-thin tantalum nitride layer comprising: providing a tantalum target; precharging the tantalum target with nitrogen by flowing nitrogen over the tantalum target; and initiating an inert gas plasma to sputter tantalum nitride onto a substrate.

A fourth aspect of the present invention is a method for fabricating an interconnect for a semiconductor device, comprising: forming a dielectric layer on a semiconductor substrate; forming a trench in the dielectric layer; placing the semiconductor substrate in a plasma deposition chamber having a tantalum target; initiating a plasma in the presence of nitrogen in the plasma deposition chamber; and depositing an ultra-thin layer comprising tantalum and nitrogen in the trench.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
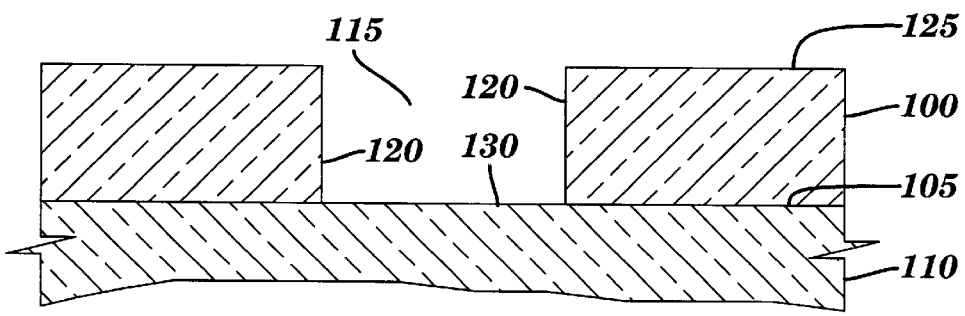
FIGS. 1A through 1D are partial cross-sectional views illustrating fabrication of a tantalum nitride/tantalum/copper interconnect according to the present invention.

FIGS. 1A through 1D are partial cross-sectional views illustrating fabrication of a tantalum nitride/tantalum/copper interconnect according to the present invention. In FIG. 1A, a dielectric layer 100 is formed on a top surface 105 of a substrate 110. In one example, substrate 110 is a semiconductor substrate. Formed in dielectric layer 100 is a trench 115 having sidewalls 120 extending from a top surface 125 of dielectric layer 100 to top surface 105 of substrate 110. Trench 115 further has a bottom 130. Dielectric layer 100 may be silicon oxide or a low-K dielectric material. In one example, the low-K dielectric material is SILK™ (Dow Corning, Midland, Mich.). Trench 115 may be formed by a reactive ion etch (RIE) process.

Figure 1B:
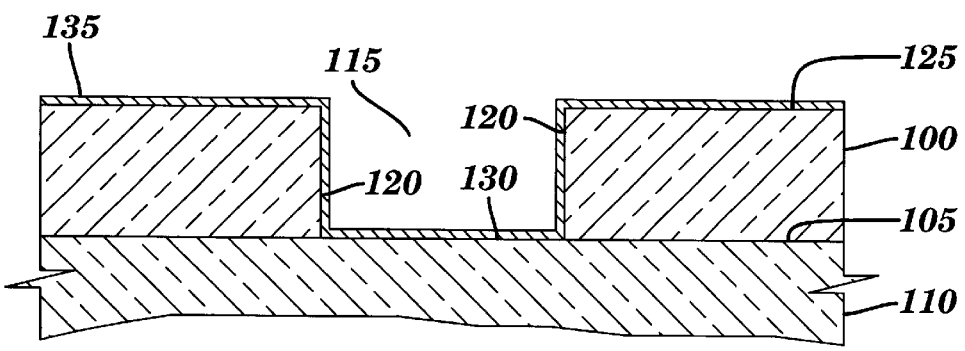
Figure 2:
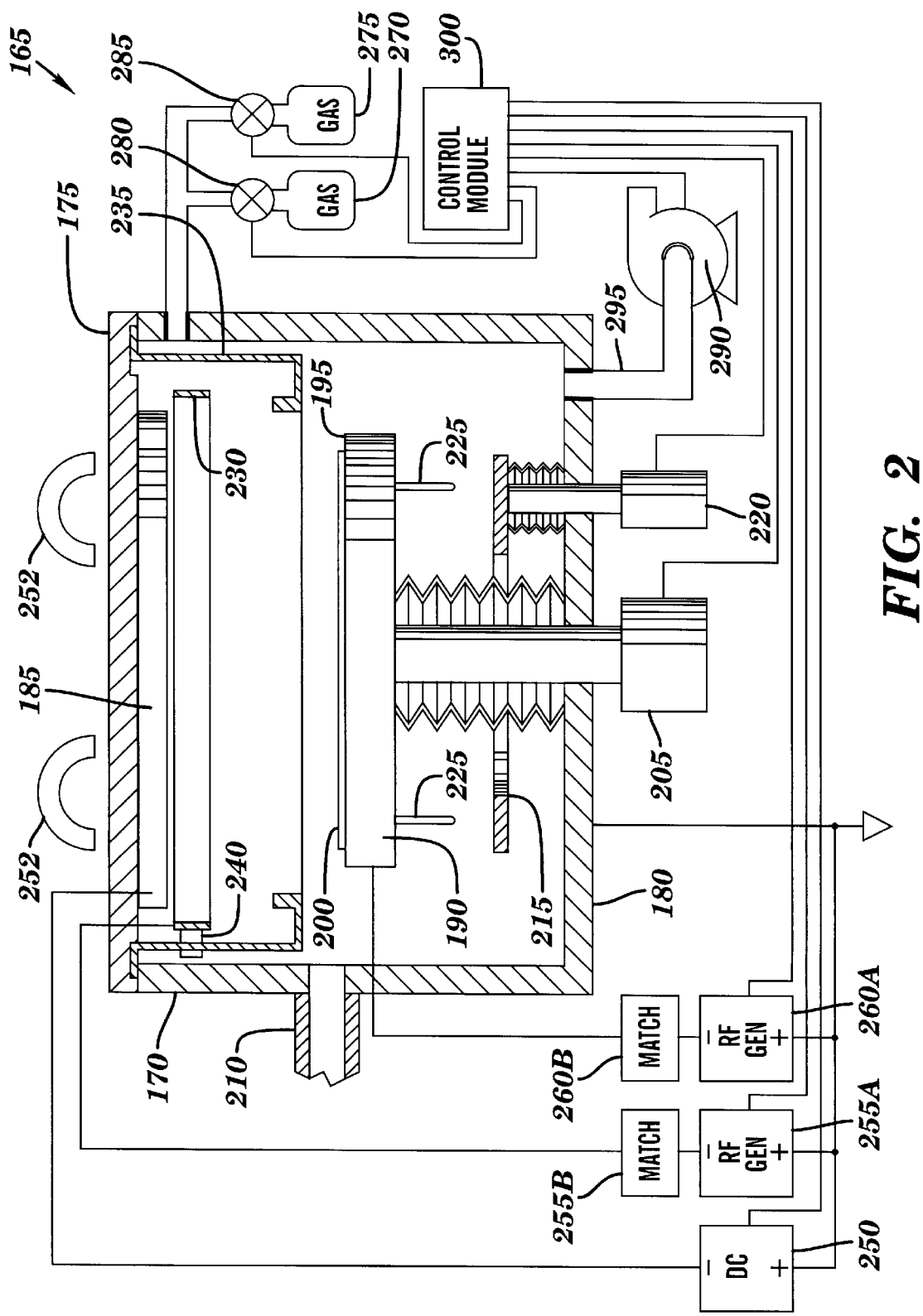
FIG. 2 is a schematic cross-sectional view of a first tool for depositing an ultra-thin tantalum nitride layer according to the present invention.
Figure 3:
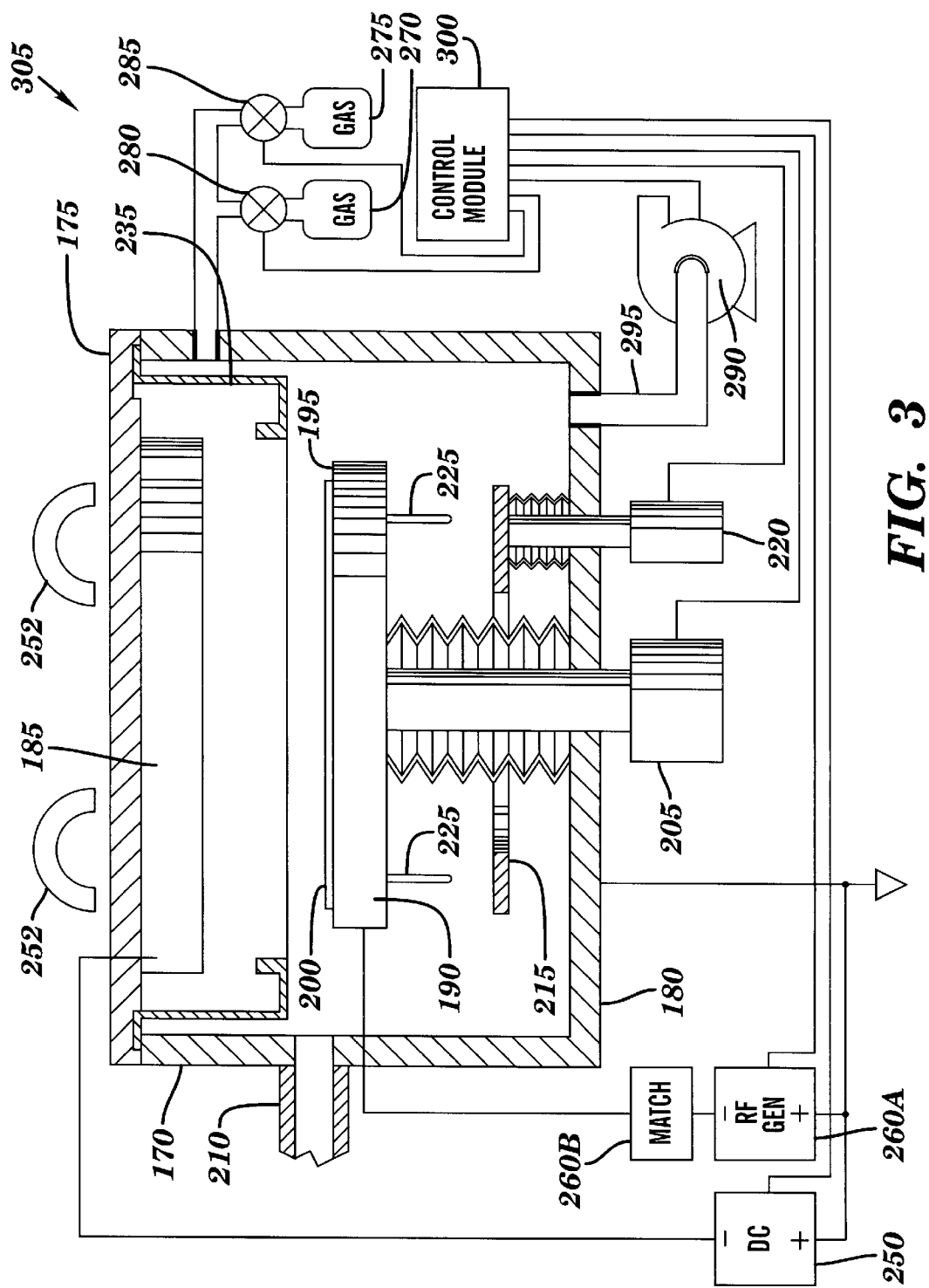
FIG. 3 is a schematic cross-sectional view of a second tool for depositing an ultra-thin tantalum nitride layer according to the present invention.
Figure 4:
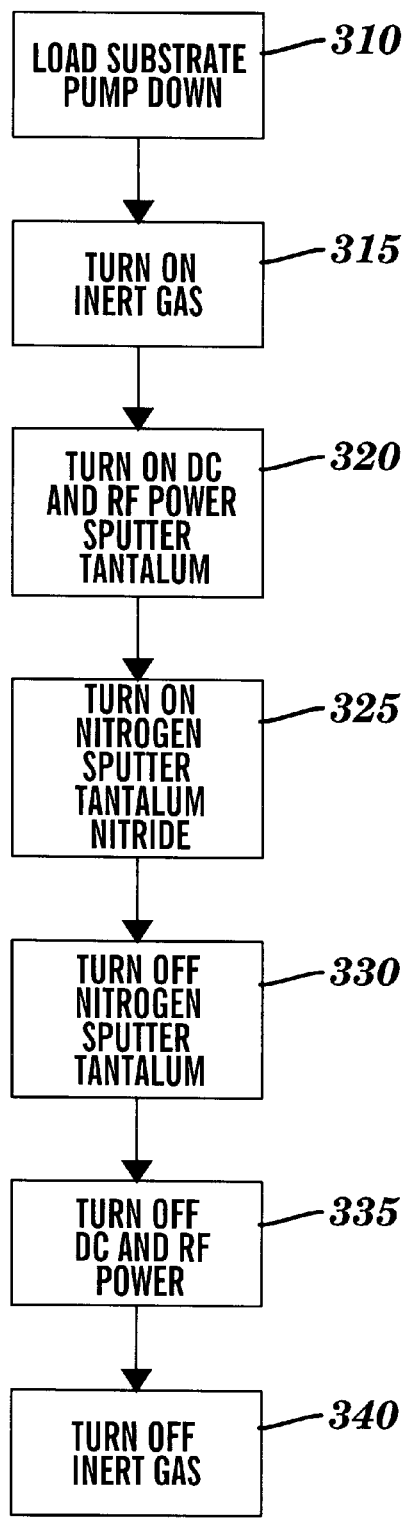
FIG. 4 is a flowchart illustrating a first method for depositing an ultra-thin tantalum nitride layer according to the present invention.
Figure 5:
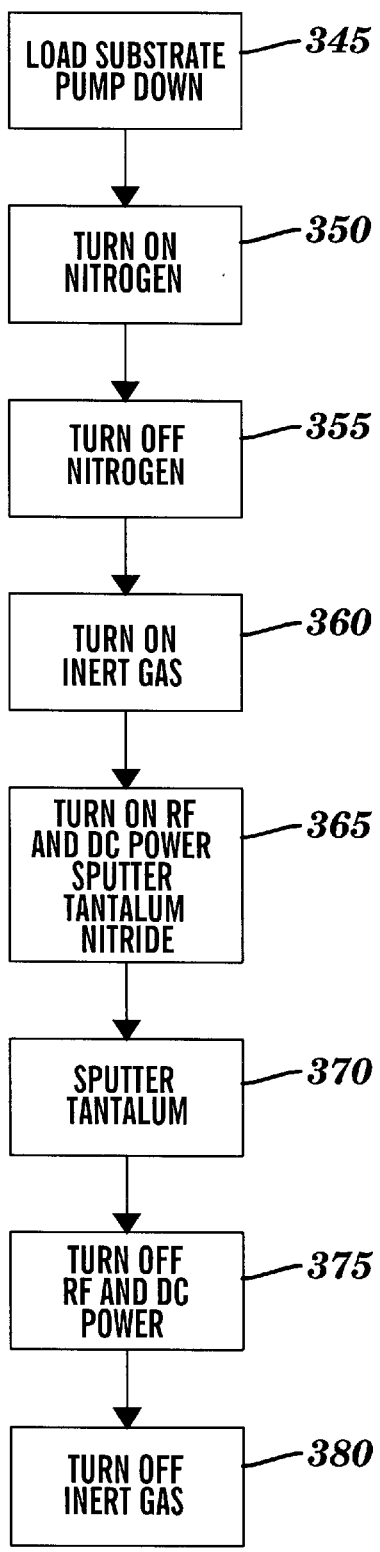
FIG. 5 is a flowchart illustrating a second method for depositing an ultra-thin tantalum nitride layer according to the present invention.

In FIG. 1B, an ultra-thin layer of tantalum nitride 135 is deposited by a plasma deposition process. The fabrication tooling for tantalum nitride layer 135 is illustrated in FIGS. 2 and 3 and described below. The process for tantalum nitride layer 135 is illustrated in FIGS. 4 and 5 and described below. Tantalum nitride layer 135 is about 0.5 to 3 nanometers thick and is a conformal coating, covering sidewalls 120 and bottom 130 of trench 115 as well as top surface 125 of dielectric layer 100. Since the molecular diameter of tantalum nitride is about 0.42 nanometers, tantalum nitride layer 135 comprises one to six monolayers.

Figure 1C:
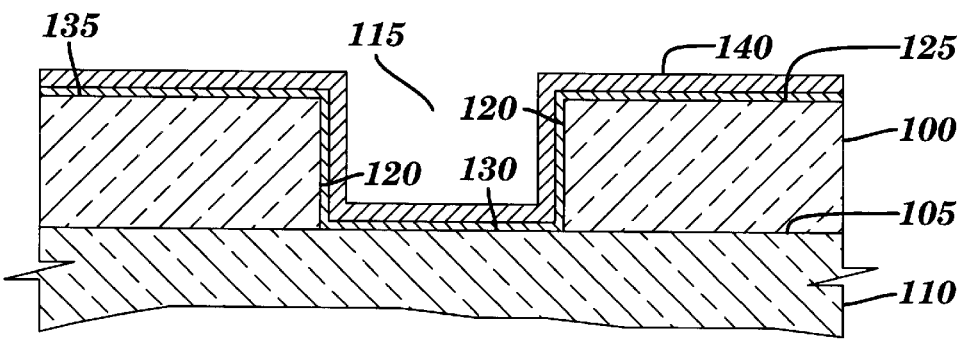

In FIG. 1C, a layer of tantalum 140 is deposited on top of tantalum nitride layer 135. Tantalum layer 140 is deposited in the same tool and chamber used for deposition of tantalum nitride layer 135 after tantalum nitride deposition. In one example, tantalum layer 140 is about 5 to 30 nanometers thick. Tantalum layer 140 forms a conformal layer over tantalum nitride layer 135.

Figure 1D:
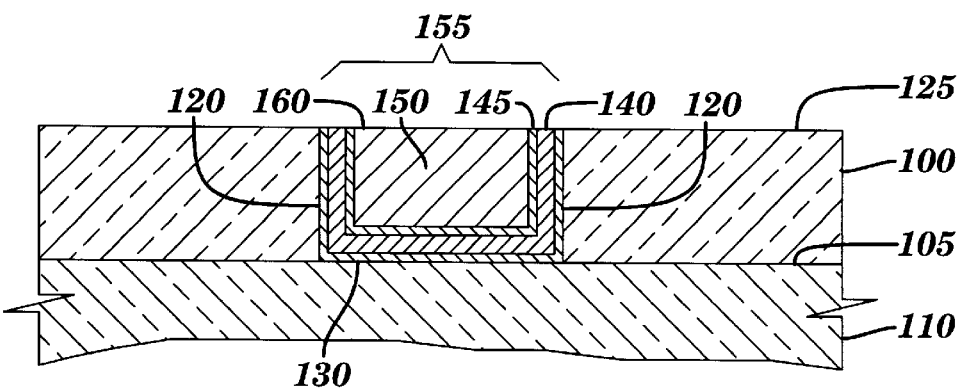

In FIG. 1D, a conformal copper seed layer 145 is formed over tantalum layer 140. Copper seed layer 145 is sputter deposited or evaporated to a thickness of about 10 to 200 nanometers. Copper seed layer may be deposited or evaporated in a second chamber of a load-lock tool, the first chamber used to form tantalum nitride layer 135 and tantalum layer 140. Copper core conductor 150 is then formed over copper seed layer 145 by electroplating to a thickness sufficient to fill in trench 115 completely. A CMP step is performed to remove tantalum nitride layer 135, tantalum layer 140, copper seed layer 145 and copper core conductor 150 from over top surface 125 of dielectric layer 100 leaving a conductive wire 155 having a top surface 160 essentially coplanar the top surface of the dielectric layer. While copper seed layer 145 is illustrated in FIG. 1D, for all practical purposes the copper seed layer becomes part of copper core conductor 150 and is indistinguishable from the copper core conductor.

FIG. 2 is a schematic cross-sectional view of a first tool for depositing an ultra-thin tantalum nitride layer according to the present invention. Chamber 165 is an ion metal plasma chamber such as the IMP Vectra™ Chamber available from Applied Materials Inc. of Santa Clara, Calif. Chamber 165 includes sidewalls 170, a lid 175 and a bottom 180. A target 185 comprising tantalum is disposed in chamber 165 on lid 175. A substrate support member 190 is movably disposed in chamber 165 and provides an upper support surface 195 for supporting a substrate 200. In one example, substrate 200 is a semiconductor substrate. Substrate support member 190 is mounted on a stem connected to a lift motor 205 that raises and lowers substrate support 190 between a lowered loading/unloading position and a raised processing position. An opening 210 in chamber 165 provides access for a robot (not shown) to deliver and retrieve substrates 200 to and from the chamber while substrate support member 190 is in the lowered loading/unloading position. A lift plate 215 connected to a lift motor 220 is mounted in chamber 165 and raises and lowers pins 225 mounted in substrate support member 190. Pins 225 raise and lower substrate 200 to and from the upper support surface 195 of substrate support member 190. A shield 235 is disposed in chamber 165 to shield sidewalls 170 from sputtered material. A coil 230 is mounted to shield 235 via supports 240 between substrate support member 190 and target 195. Coil 230 provides RF energy to assist in initiating and maintaining the plasma as well as increasing plasma density in order to increase the quantity of ionized species within the plasma. Supports 240 electrically insulate the coil 230 from the shield 235 and chamber 165. Three power supplies are used in the chamber 165. A DC power source 250 delivers DC power to target 185 to cause the processing gas to form a plasma. Spinning magnets 252 disposed behind target 185 form magnetic field lines at the target surface which trap electrons and increase the density of the plasma adjacent to the target in order to increase the sputtering efficiency. A first RF power source supplies RF power to coil 230 through a first matching network 255B to increase the density of the plasma. A second RF power source 260A, biases substrate support member 190 with respect to the plasma through a second matching network 260B and provides directional attraction of the ionized sputtered material toward the substrate 200. Two plasma gases are supplied to chamber 165 through a gas inlet 265 from gas sources 270, 275 as metered by respective mass flow controllers 280 and 285. In the present example, the first gas is nitrogen and the second gas is an inert gas such as argon, helium, neon or krypton or a combination thereof. One or more vacuum pumps 290 are connected to chamber 165 at an exhaust port 295 to exhaust the chamber and maintain the desired pressure in the chamber. In one example vacuum pump 290 is a cryopump or any pump capable of sustaining a low pressure of about $10^{-8}$ Torr. A controller 300 controls the functions of the power supplies 250, 255A and 260A, matching networks 255B and 260B, lift motors 205 and 220, mass flow controllers 280 and 285, vacuum pump 290 and other associated chamber components and functions. Controller 300 executes system control software stored in a memory, which in the in one example is a hard disk drive, and can include analog and digital input/output boards, interface boards and stepper motor controller boards. Optical and/or magnetic sensors are generally used to move and determine the position of movable mechanical assemblies.

In operation, a robot delivers a substrate 200 to chamber 165 through opening 210. Pins 225 are extended upward to lift substrate 200 from the robot. The robot then retracts from chamber 165 and opening 210 is sealed. Pins 225 lower substrate 200 to upper surface 195 of substrate support member 190. Substrate support member 190 raises substrate 200 into processing position under target 185. One or more plasma gases are then introduced into chamber 165 to stabilize the chamber at a process pressure. A plasma is generated between target 185 and substrate support member 190 with power from DC power source 250. The first RF power source 255A delivers power to the coil 230 to create a plasma sufficiently dense to ionize the flux of sputtered target material from the target 185. The ions are accelerated toward substrate 200, which is biased, by second RF power source 260A. After deposition, substrate support member 190 is lowered, pins 225 are raised to lift substrate 200, the robot enters chamber 165 to retrieve substrate 200, and if desired, delivers another substrate for processing.

FIG. 3 is a schematic cross-sectional view of a second deposition tool for depositing an ultra-thin tantalum nitride layer according to the present invention. FIG. 3 represents a generic DC magnetron plasma deposition tool. Chamber 305 includes sidewalls 170, lid 175 and bottom 180. Target 185 comprising tantalum is disposed in chamber 305 on lid 175. Substrate support member 190 is movably disposed in chamber 305 and provides upper support surface 195 for supporting substrate 200. Substrate support member 190 may comprise an electrostatic wafer chuck. Substrate support member 190 is mounted on a stem connected to lift motor 205 that raises and lowers substrate support member 190 between a lowered loading/unloading position and a raised processing position. Opening 210 in chamber 305 provides access for a robot (not shown) to deliver and retrieve substrates 200 to and from the chamber while substrate support member 190 is in the lowered loading/unloading position. Lift plate 215 connected to lift motor 220 is mounted in chamber 305, raises, and lowers pins 225 mounted in substrate support member 190. Pins 225 raise and lower substrate 200 to and from upper support surface 195 of substrate support member 190. Shield 235 is disposed in chamber 305 to shield sidewalls 170 from sputtered material. Two power supplies are used in chamber 305. DC power source 250 delivers DC power to target 185 to cause the processing gas to form a plasma. Spinning magnets 252 disposed behind target 185 form magnetic field lines at the target surface which trap electrons and increase the density of the plasma adjacent to the target in order to increase the sputtering efficiency. RF power source 260A, biases substrate support member 190 with respect to the plasma through matching network 260B and provides directional attraction of the ionized sputtered material toward substrate 200. Optionally, no bias is applied to substrate support member 190 and FR power source 260A and matching network are not used or not included as part of chamber 305. Two plasma gases are supplied to chamber 305 through a gas inlet 265 from gas sources 270, 275 as metered by respective mass flow controllers 280 and 285. In the present example, the first gas is nitrogen and the second gas is an inert gas such as argon, helium, neon or krypton or a combination thereof. One or more vacuum pumps 290 are connected to the chamber 305 at exhaust port 295 to exhaust the chamber and maintain the desired pressure in the chamber. In one example vacuum pump 290 is a cryopump or any pump capable of sustaining a low pressure of about $10^{-8}$ Torr. Controller 300 controls the functions of power supplies 250 and 260A, matching network 260B, lift motors 205 and 220, mass flow controllers 280 and 285, vacuum pump 290 and other associated chamber components and functions. Controller 300 executes system control software stored in a memory, which in the in one example is a hard disk drive, and can include analog and digital input/output boards, interface boards and stepper motor controller boards. Optical and/or magnetic sensors are generally used to move and determine the position of movable mechanical assemblies.

In operation, a robot delivers a substrate 200 to chamber 305 through opening 210. Pins 225 are extended upward to lift substrate 200 from the robot. The robot then retracts from chamber 305 and opening 210 is sealed. Pins 225 lower substrate 200 to upper surface 195 of substrate support member 190. Substrate support member 190 raises substrate 200 into processing position under target 185. One or more plasma gases are then introduced into chamber 305 to stabilize the chamber at process pressure. A plasma is generated between target 185 and substrate support member 190 with power from DC power source 250 and RF power source 260A to create a plasma sufficiently dense to ionize the flux of sputtered target material from the target 185. The ions are accelerated toward substrate. Additionally, non-ionized metal species dislodged from target 185 will deposit on the substrate. After deposition, substrate support member 190 is lowered, pins 225 are raised to lift substrate 200, the robot enters chamber 305 to retrieve substrate 200, and if desired, delivers another substrate for processing.

FIG. 4 is a flowchart illustrating a first method for depositing an ultra-thin tantalum nitride layer according to the present invention. The first method may be used with either the first tool illustrated in FIG. 2 or the second tool illustrated in FIG. 3 and described above. In step 310, a substrate 200 is loaded into the deposition chamber and the chamber is pumped down to about $10^{-8}$ Torr. In step 315, an inert gas such as argon, helium, neon, krypton or a combination thereof is allowed to flow into the deposition chamber at a rate of about 5 to 200 sccm. The following steps, 320 and 325 occur simultaneously. In step 320, DC and RF power is turned on initiating an inert gas plasma and tantalum starts to sputter from target 185. With chamber 165, about 500 to 3000 watts applied is to target 185 by DC power supply 250, about 500 to 5000 watts is applied to coil 230 by RF power supply 255A and about 10 to 500 watts is applied to substrate support member 190 by RF power supply 260A. With chamber 305 about 500 to 3000 watts is applied to target 185 by DC power supply 250 and about 10 to 500 watts is applied to substrate support member 190 by RF power supply 260A. With either chamber 165 or 305, substrate 200 is maintained at a temperature of about 0° C. to 200° C. and the tantalum-sputtering rate is controlled to between about 2 to 50 Å per second for all subsequent process steps. In step 325, nitrogen is allowed to flow as soon as tantalum sputtering begins. Nitrogen is allowed to flow at the rate of about 5 to 200 sccm for about 1 to 15 seconds while tantalum sputtering continues. During step 325, two processes take place. In the first process, tantalum atoms react with nitrogen ions in the plasma to form tantalum nitride, which deposits on substrate 200. In the second process, a tantalum nitride layer is formed on target 185, which is then sputtered off to deposit on substrate 200. In step 330, nitrogen flow is turned off and tantalum continues to be sputtered. Tantalum sputtering is allowed to continue until a pre-determined thickness of tantalum is deposited on top of the tantalum layer deposited in step 325. In step 335, the RF and DC power is turned off, the plasma collapses, tantalum sputtering and deposition stop. Finally, in step 340, the inert gas flow is turned off and substrate 200 is removed from the deposition chamber.

FIG. 5 is a flowchart illustrating a second method for depositing an ultra-thin tantalum nitride layer according to the present invention. The second method may be used with either the first tool illustrated in FIG. 2 or the second tool illustrated in FIG. 3 and described above. In step 345, a substrate 200 is loaded into the deposition chamber and the chamber is pumped down to about $10^{-8}$ Torr. In step 350, nitrogen is turned on and allowed to flow at a rate of about 50 to 200 sccm. After a predetermined amount of time, in step 355, nitrogen flow is stopped. Nitrogen is allowed to flow long enough to be absorbed on the surface of target 185 or to react with the tantalum of the target to form a thin tantalum nitride layer on the surface of the target. Additionally, nitrogen may be absorbed by coil 230 and sputtered from the coil as well. Step 350 effectively precharges the surface of target 185 with nitrogen. In step 360, an inert gas such as argon, helium, neon, krypton or a combination thereof is allowed to flow into the deposition chamber at a rate of about 5 to 200 sccm. In step 365, DC and RF power is turned on initiating an inert gas plasma and tantalum nitride starts to sputter from target 185. It is important that the plasma be struck between about 0 to 2 seconds of turning on of the inert gas flow in order that the nitrogen absorbed on the surface of target 185 is not flushed off. During step 365, as tantalum and nitrogen are sputtered off target 185, tantalum nitride is formed which deposits on substrate 200. With chamber 165, about 500 to 3000 watts applied is to target 185 by DC power supply 250, about 500 to 5000 watts is applied to coil 230 by RF power supply 255A and about 10 to 500 watts is applied to substrate support member 190 by RF power supply 260A. With chamber 305 about 500 to 3000 watts is applied to target 185 by DC power supply 250 and about 10 to 500 watts is applied to substrate support member 190 by RF power supply 260A. With either chamber 165 or 305, substrate 200 is maintained at a temperature of about 0° C. to 200° C. In step 370, the absorbed nitrogen is used up and tantalum sputtering begins. Tantalum sputtering is allowed to continue until a pre-determined thickness of tantalum is deposited on top of the tantalum layer deposited in step 360. In step 375, the RF and DC power is turned off, the plasma collapses, tantalum sputtering and deposition stop. Finally, in step 380, the inert gas flow is turned off and substrate 200 is removed from the deposition chamber.

A requirement of an ultra-thin tantalum nitride film is that it be continuous to avoid formation of beta-phase tantalum when tantalum is used a redundant conductor. As was noted above, beta-phase tantalum has a much higher resistivity than alpha phase tantalum. If the tantalum nitride layer is not continuous in a via formed in silicon oxide, beta-phase tantalum will be formed when a tantalum liner is formed. The presence of beta-phase tantalum can be determined by a simple resistivity measurement and forms the basis for determining if the ultra-thin tantalum layer of the present invention is continuous.

EXAMPLE

Two pairs of copper via chain structures were fabricated. One via chain in the pair comprised 68,000 vias in series and the second via chain comprised 100 vias in series. Each via in each chain was one micron deep by 0.4 micron in diameter and formed in a silicon oxide dielectric. The first pair was fabricated using a thick tantalum nitride liner having a thickness of 10 nanometers and a tantalum liner having a thickness of 40 nanometers. The second pair was fabricated using an ultra-thin tantalum nitride according to the present invention, the liner having a thickness of 1 to 3 nanometers and a tantalum liner having a thickness of 40 nanometers. Forty chains on each of forty locations on four wafers were measured. Table I lists the measured resistivity in ohms per link and standard deviation of each via chain for both the thick and the ultra-thin tantalum nitride lined via chains.

TABLE I

| | Thick TaN | Ultra-Thin TaN |
| --- | --- | --- |
| First via chain resistivity | 0.618 | 0.594 |
| Standard deviation | 0.014 | 0.001 |
| Second via chain resistivity | 0.858 | 0.792 |
| Standard deviation | 0.013 | 0.001 |

Since the resistivity of the ultra-thin tantalum nitride cells are virtually the same as the resistivity of the thick tantalum nitride cells, no beta phase tantalum was formed and it can be concluded that the ultra-thin tantalum nitride layer was continuous.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An interconnect for a semiconductor device, comprising:
    a conductive core having sidewalls and a bottom; and
    an ultra-thin layer disposed on said sidewalls and said bottom of said conductive core, said ultra-thin layer being 0.5 to 3 nanometers in thickness.

2. The interconnect of claim 1, wherein said conductive core comprises copper and said ultra-thin layer comprises tantalum nitride.

3. The interconnect of claim 1, wherein said ultra-thin layer comprises one to seven monolayers of tantalum nitride.

4. The interconnect of claim 1, further comprising an alpha-tantalum layer between said core conductor and said ultra-thin layer.

5. The interconnect of claim 4, wherein said alpha-tantalum layer is about 5 to 30 nanometers thick.

6. The interconnect of claim 2, further comprising an alpha-tantalum layer between said core conductor and said ultra-thin layer.

7. A method of forming an ultra-thin tantalum nitride layer comprising:
    providing a tantalum target;
    initiating an inert gas plasma and flowing nitrogen into the plasma for a predetermined period of time sufficient to sputter 0.5 to 3 nanometers of tantalum nitride onto a substrate; and
    after expiration of said predetermined period of time, stopping the flow of nitrogen.

8. The method of claim 7, further including sputtering a tantalum layer on top of said ultra-thin layer.

9. The method of claim 7, wherein said tantalum nitride layer comprises one to seven monolayers.

10. A method of forming an ultra-thin tantalum nitride layer comprising:
    providing a tantalum target;
    precharging said tantalum target with nitrogen by flowing nitrogen over said tantalum target; and
    initiating an inert gas plasma to sputter tantalum nitride onto a substrate.

11. The method of claim 10, further including sputtering a tantalum layer on top of said ultra-thin layer.

12. The method of claim 10, wherein said nitrogen precharge is only sufficient to produce a tantalum nitride layer no thicker than 3 nanometers.

13. The method of claim 10, wherein said nitrogen precharge is only sufficient to produce a tantalum nitride layer comprising one to seven monolayers.

14. A method for fabricating an interconnect for a semiconductor device, comprising:
    forming a dielectric layer on a semiconductor substrate;
    forming a trench in said dielectric layer;
    placing said semiconductor substrate in a plasma deposition chamber having a tantalum target;
    initiating a plasma in the presence of nitrogen in said plasma deposition chamber; and depositing an ultra-thin layer comprising tantalum and nitrogen in said trench, said ultra-thin layer having a thickness of 0.5 to 3 nanometers.

15. The method of claim 14, wherein said nitrogen is introduced into said plasma deposition chamber as nitrogen gas after plasma initiation.

16. The method of claim 14, wherein nitrogen is introduced into said plasma deposition chamber to precharge the surface of said tantalum target before plasma initiation.

17. The method of claim 14, wherein said ultra-thin layer comprising tantalum and nitrogen comprises one to seven monolayers of tantalum and nitrogen.

18. The method of 14, further including sputtering an alpha-tantalum layer on top of said ultra-thin layer.

19. The method of claim 14, wherein said dielectric layer comprises materials selected from the group consisting of silicon oxide, low-K dielectrics and SILK™.

20. The method of claim 14 wherein said plasma deposition chamber is a DC magnetron chamber.

21. The method of claim 14 wherein said plasma deposition chamber is an ion metal plasma chamber.

22. The method of claim 14, wherein said trench is a high aspect ratio trench.

* * * * *